(12) United States Patent
Shah et al.

(10) Patent No.: US 9,491,891 B2
(45) Date of Patent: Nov. 8, 2016

(54) SYSTEM AND DESIGN OF COST EFFECTIVE CHASSIS DESIGN FOR NETWORKING PRODUCTS

(71) Applicant: DELL PRODUCTS L.P., Round Rock, TX (US)

(72) Inventors: Haresh K. Shah, Los Altos Hills, CA (US); Saikrishna M. Kotha, Austin, TX (US)

(73) Assignee: DELL PRODUCTS L.P, Round Rock, TX (US)

( * ) Notice: Subject to any disclaimer, the term of this patent is extended or adjusted under 35 U.S.C. 154(b) by 65 days.

(21) Appl. No.: 14/547,710

(22) Filed: Nov. 19, 2014

(65) Prior Publication Data

US 2015/0138725 A1 May 21, 2015

Related U.S. Application Data

(63) Continuation of application No. 13/674,879, filed on Nov. 12, 2012, now Pat. No. 8,922,992.

(51) Int. Cl.
*H05K 7/20* (2006.01)
*G06F 1/20* (2006.01)
*H05K 7/14* (2006.01)
*H01L 23/473* (2006.01)

(52) U.S. Cl.
CPC .......... *H05K 7/20736* (2013.01); *G06F 1/20* (2013.01); *H05K 7/1488* (2013.01); *H05K 7/1492* (2013.01)

(58) Field of Classification Search
CPC ...... G06F 1/18–1/189; G06F 1/1613–1/1698; H05K 7/20218–7/20381; H05K 7/20409–7/20418; H05K 7/20009–7/202; H05K 7/00–7/186; H05K 5/00–5/069; H01L 23/46–23/3677
USPC ....... 361/756, 741, 686, 687, 725, 787, 789, 361/794, 807–810, 676–678, 361/679.46–679.54, 688–723; 348/787, 348/789, 794; 349/56–60; 165/80.1–80.5, 165/104.33, 185; 174/15.1–15.3, 174/16.1–16.3, 547, 548; 257/712–722, 257/E23.088; 24/453, 458–459; 454/184; 312/236

See application file for complete search history.

(56) References Cited

U.S. PATENT DOCUMENTS

| | | | |
|---|---|---|---|
| 6,151,210 A * | 11/2000 | Cercioglu ......... | H05K 7/20572 165/104.33 |
| 6,198,630 B1 * | 3/2001 | Cromwell .......... | H01L 23/4006 165/80.3 |
| 6,449,150 B1 * | 9/2002 | Boone ................ | H05K 7/20563 165/104.33 |
| 6,563,706 B1 * | 5/2003 | Strickler ........... | H05K 7/20718 165/122 |
| 6,785,142 B1 | 8/2004 | Regimbal et al. | |

(Continued)

*Primary Examiner* — Anthony Haughton
*Assistant Examiner* — Razmeen Gafur
(74) *Attorney, Agent, or Firm* — Haynes & Boone, LLP (57) ABSTRACT

An electrical equipment chassis includes a frame open to a first side and an opposite second side and a power board located near a mid-plane of the chassis coupling power supply modules to first networking modules and a second networking module. A first region open to the first side can receive first power supply modules. A second region open to the first side is adjacent to the first region and can receive the first networking modules and the second networking module oriented with a first orientation. A third region open to the second side can receive fan trays with fans and third networking modules. The third networking modules are oriented orthogonal to the first orientation. The power board at least partially separates the first and third regions and only partially separates the second and third regions. The chassis permits air flow from the first side to the second side.

20 Claims, 7 Drawing Sheets

(56) References Cited

U.S. PATENT DOCUMENTS

| | | | |
|---|---|---|---|
| 7,088,583 B2 | 8/2006 | Brandon et al. | |
| 8,064,200 B1 | 11/2011 | West et al. | |
| 8,792,243 B2 | 7/2014 | Babcock et al. | |
| 2003/0214781 A1* | 11/2003 | Kolb | G06F 1/206 361/679.33 |
| 2003/0221817 A1 | 12/2003 | Smith et al. | |
| 2004/0001311 A1* | 1/2004 | Doblar | G06F 1/20 361/679.49 |
| 2004/0008484 A1* | 1/2004 | Konshak | G06F 1/184 361/679.5 |
| 2004/0150950 A1 | 8/2004 | Brooks et al. | |
| 2004/0228090 A1* | 11/2004 | Blackwell | H05K 7/1457 361/695 |
| 2005/0207134 A1* | 9/2005 | Belady | H05K 1/14 361/796 |
| 2005/0276017 A1 | 12/2005 | Aziz et al. | |
| 2006/0227505 A1 | 10/2006 | Miyamoto et al. | |
| 2006/0256522 A1 | 11/2006 | Wei et al. | |
| 2007/0013061 A1* | 1/2007 | Chen | H05K 1/0274 257/728 |
| 2007/0178822 A1 | 8/2007 | Lanus et al. | |
| 2007/0213000 A1* | 9/2007 | Day | H05K 7/20745 454/184 |
| 2007/0232089 A1* | 10/2007 | Fung | H05K 1/14 439/65 |
| 2007/0274039 A1* | 11/2007 | Hamlin | H05K 7/2019 361/695 |
| 2008/0043427 A1* | 2/2008 | Lee | G06F 1/1601 361/679.48 |
| 2008/0112133 A1* | 5/2008 | Torudbakken | H04Q 1/04 361/694 |
| 2008/0180918 A1 | 7/2008 | Baker et al. | |
| 2008/0192431 A1* | 8/2008 | Bechtolsheim | H05K 7/20727 361/695 |
| 2008/0310121 A1* | 12/2008 | Yamashita | H01R 9/226 361/720 |
| 2009/0016019 A1* | 1/2009 | Bandholz | H05K 7/20736 361/695 |
| 2009/0086422 A1* | 4/2009 | McClure | H05K 7/20772 361/679.48 |
| 2009/0097203 A1* | 4/2009 | Byers | H05K 7/20618 361/695 |
| 2009/0109610 A1* | 4/2009 | Hirai | G06F 1/20 361/679.46 |
| 2009/0109619 A1* | 4/2009 | Wise | H05K 7/20836 361/695 |
| 2009/0135558 A1* | 5/2009 | Hughes | H05K 7/20727 361/679.46 |
| 2009/0260795 A1* | 10/2009 | Perazzo | H05K 7/20572 165/269 |
| 2009/0296352 A1 | 12/2009 | Lima | |
| 2010/0002382 A1* | 1/2010 | Aybay | H05K 7/20563 361/695 |
| 2010/0014248 A1* | 1/2010 | Boyden | H05K 7/20563 361/695 |
| 2010/0315771 A1 | 12/2010 | Wu et al. | |
| 2011/0080701 A1* | 4/2011 | Bisson | H05K 7/20563 361/679.5 |
| 2011/0188220 A1* | 8/2011 | Blackwell, Jr. | H05K 1/11 361/802 |
| 2011/0192587 A1 | 8/2011 | Lima | |
| 2011/0194245 A1* | 8/2011 | Wu | G06F 1/184 361/679.48 |
| 2011/0222241 A1* | 9/2011 | Shearman | H05K 7/20572 361/692 |

* cited by examiner

SYSTEM AND DESIGN OF COST EFFECTIVE CHASSIS DESIGN FOR NETWORKING PRODUCTS

CROSS-REFERENCE TO RELATED APPLICATIONS

This application is a continuation of U.S. Patent Application No. 13/674,879, filed Nov. 12, 2012, which is hereby incorporated by reference in its entirety.

BACKGROUND

The present disclosure relates generally to information handling systems, and more particularly to a chassis design relating to network switching products. But it would be recognized that the invention has a much broader range of applicability.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

With the advent of centralized locations for storing data associated with network services (retail services, financial services, communication/social networking services, database services to name only a few), network devices such as switches and routers are designed to very quickly process and route large volumes of network traffic. Such centralized locations are typically referred to as data centers.

Network switching products form the interconnection backbone in data centers. In order to support large numbers of network switching products, these network switching products are often designed around standard form factors and sizes. Typically these form factors and sizes are designed so that the network switching products can be rack mounted using interchangeable slots. A common feature in the rack-mounted arrangement is a chassis. A typical chassis includes a rigid frame with one or more power supplies and one or more interchangeable slots for receiving a corresponding one or more network switching products. Chassis have been typically designed to provide both flexibility and redundancy in network configuration and operation. By using interchangeable slots, the number and variety of network switching products that are installed is flexible. Not only does this provide the ability to swap out defective network switching products and to upgrade previously installed network switching products, it also provides for the ability to add additional network switching products to previously installed chassis, subject to space availability. In addition, with the advent of hot-swappable network switching products, it is possible to replace a network switching product while the other network switching products in the system remain active and functioning.

One common type of chassis includes a backplane. The backplane is typically a fixed interconnection unit that provides connectivity and routing between the various network switching line cards are inserted into the slots of the chassis. For example, the backplane includes a circuit board with various card edge connectors into which each of the network switching products are inserted. The circuit board generally contains an extensive bus and point-to-point wiring pattern that interconnects pins between the card edge connectors that allow each of the network switching products to communicate. In another example, the circuit board includes power supply wiring for supplying power to each of the network switching line cards. The use of a backplane places certain limits on the capabilities of the chassis to support additional and upgraded network switching products. For example, one such limit is the number of slots (i.e., card edge connectors) provided by the backplane, this is typically fixed in number and provides a finite upper limit on the number of network switching capability the chassis supports. The design of card edge connectors and the backplane circuit board can place additional limits on upgradability due to limitations associated with signal integrity, frequency limits, and the like. Further, the use of a monolithic backplane may interfere significantly with cooling airflow between the front and back of the chassis. Not only does the backplane design impose a high infrastructure cost, but the limitations typically limit the effective life span of the backplane-based chassis.

More recently, chassis design has begun to migrate away from the backplane design to a mid-plane design. In a mid-plane design, the interconnect circuit board is moved from the back of the chassis to near the center of the chassis. For example, network switching products in the form of line cards are inserted from the front of the chassis into card edge, or similar, connectors on the front surface of the mid-plane interconnect circuit board. Additional network switching cards in the form of route processor modules (RPMS) or fabric cards are inserted from the rear of the chassis into card edge, or similar, connectors on the rear surface of the mid-plane interconnect circuit board. In some examples, the interconnect model is orthogonal in nature such that the line cards are inserted into the mid-plane interconnect circuit board in a first orientation (e.g., vertical) and the RPMs are inserted into the mid-plane interconnect circuit board in a second orientation that is orthogonal to the first orientation (e.g., horizontal). As in the case of the backplane chassis, the presence of the mid-plane interconnect circuit board in the mid-plane chassis places the same limits on the chassis related to slot capacity, electrical signal characteristics, and interference with cooling airflow between the front and back of the chassis.

Accordingly, it would be desirable to provide an improved chassis design that provides greater flexibility in slot capacity, increased longevity due to ability to adapt to ever increasing electrical signal characteristics, and/or better support for cooling airflow through the chassis.

SUMMARY

According to one embodiment, an electrical equipment chassis includes a frame open to a first side of the chassis and a second side of the chassis opposite the first side, the frame separating the chassis into a first region, a second region, and a third region and a power distribution board located near a mid-plane of the chassis and including one or more power module connectors for coupling one or more first power supply modules to the power distribution board and one or more first power connectors for coupling one or more first networking modules and a second networking module to the power distribution board. The first region is open to the first side of the chassis and is configured to receive the one or more first power supply modules for supplying power to the chassis. The second region is open to the first side of the chassis, is adjacent to the first region, and is configured to receive the one or more first networking modules and the second networking module. The one or more first networking modules and the second networking module are oriented with a first orientation. The third region is open to the second side of the chassis and is configured to receive one or more fan trays and one or more third networking modules. The one or more third networking modules are oriented with a second orientation orthogonal to the first orientation. The one or more fan trays each includes one or more fans. The power distribution board at least partially separates the first region from the third region and only partially separates the second region from the third region. At least one of the second networking module, the one or more fan trays, or the one or more third networking modules adds stability to the frame. The chassis is sufficiently open to permit air flow from the first side to the second side.

According to another embodiment, an information handling system includes one or more electrical equipment chassis. Each of the electrical equipment chassis includes a frame open to a first side of the chassis and a second side of the chassis opposite the first side, the frame separating the chassis into a first region, a second region, and a third region and a power distribution board located near a mid-plane of the chassis and including one or more power module connectors for coupling the one or more first power supply modules to the power distribution board and one or more first power connectors for coupling one or more first networking modules and a second networking module to the power distribution board. The first region is open to the first side of the chassis and is configured to receive the one or more first power supply modules for supplying power to the chassis. The second region is open to the first side of the chassis, is adjacent to the first region, and is configured to receive the one or more first networking modules and the second networking module. The one or more first networking modules and the second networking module are oriented with a first orientation. The third region is open to the second side of the chassis and is configured to receive one or more fan trays and one or more third networking modules. The one or more third networking modules are oriented with a second orientation orthogonal to the first orientation. The one or more fan trays each includes one or more fans. The power distribution board at least partially separates the first region from the third region and only partially separates the second region from the third region. At least one of the second networking module, the one or more fan trays, or the one or more third networking modules adds stability to the frame. The chassis is sufficiently open to permit air flow from the first side to the second side.

In the figures, elements having the same designations have the same or similar functions.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
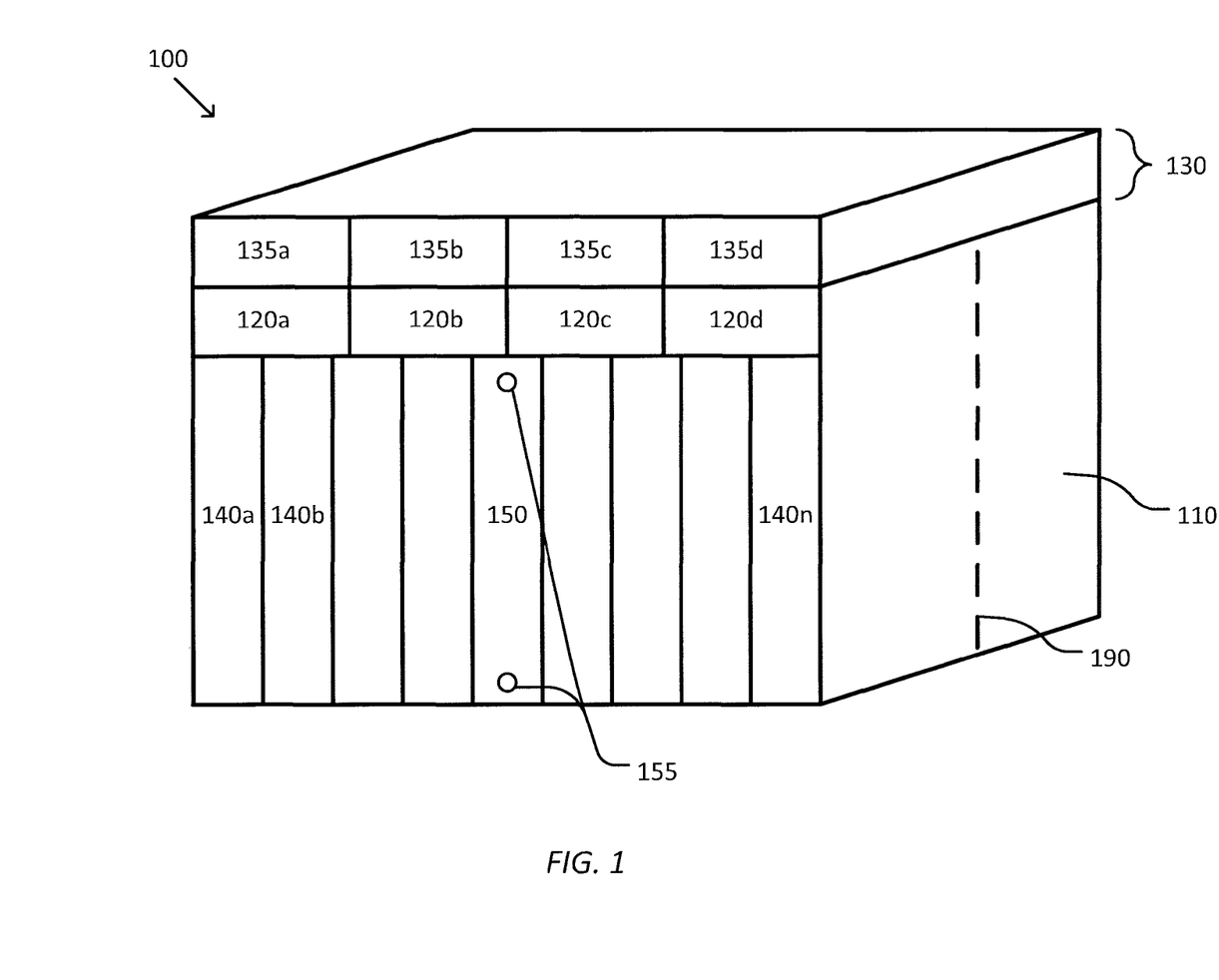
FIG. 1 shows a simplified front view diagram of an example of a chassis according to some embodiments of the present invention.

FIG. 1 shows a simplified front view diagram of an example of a chassis 100 according to some embodiments of the present invention. As shown in FIG. 1, the chassis 100 is configured around a box like frame 110, sometimes called the hem. The frame 110 is configured to receive various types of modules depending upon the desired configuration and function of the modules inserted into the chassis 100. The frame 110 will be described further below. The chassis further includes a virtual mid-plane 190 where interconnections can be made between various modules as will be described further below.

As further shown in FIG. 1, the chassis 100 can be configured to receive one or more first power supply modules 120*a*-120*d*. For example, four first power supply modules 120*a*-120*d* are depicted, but one of ordinary skill in the art would recognize that fewer or more power supply modules can be used. Each of the one or more power supply modules 120*a*-120*d* are configured to supply one or more voltage levels and power to the other modules inserted into the chassis 100. For example, the one or more power supply modules 120*a*-120*d* can supply 12 VDC, 54 VDC, and/or any other voltage level necessary to support the functionality of the modules inserted into the chassis 100. Also shown with the chassis 100 is an optional auxiliary power shelf 130. The auxiliary power shelf 130 provides the capability to add an additional one or more auxiliary power supply modules 135*a*-135*d* to the chassis 100. In some embodiments, the one or more auxiliary power supply modules 135*a*-135*d* can provide extra power capabilities to the other modules inserted into the chassis 100. According to some embodiments, the one or more auxiliary power supply modules 135*a*-135*d* can provide power to additional devices that are connected into the modules. In some embodiments, the one or more auxiliary power supply modules 135*a*-135*d* can provide 54 VDC to support Power over Ethernet.

FIG. 1 further shows that one or more first networking modules 140*a*-140*n* can be inserted into chassis 100. The one or more first networking modules 140*a*-140*n* can include one or more line card modules and/or one or more service modules. The number of first networking modules 140*a*-140*n* depends on a width of each of the first networking modules 140*a*-140*n* and a width of the chassis 100. The number of first networking modules 140*a*-140*n* also depends on the number of first networking modules 140*a*-140*n* to fulfill the networking switching capabilities. It is not required that all of the one or more first networking modules 140*a*-140*n* be installed in a single chassis 100, or that chassis 100 be completely filled.

According to some embodiments, a second networking module 150 can be inserted into chassis 100. For example, the second networking module 150 can be a network uplink module. As shown in FIG. 1, the second networking module 150 can be affixed to the chassis 100 using one or more fasteners 155. The one or more fasteners 155 can be configured to affix the second networking module 150 to the frame 110. For example, the one or more fasteners 155 can be knurled screws. By affixing the second networking module 150 to the frame 110, the second networking module 150 can be configured to add structural stability to the frame 110. The second networking module 150 can typically be inserted into the chassis 100 near the horizontal mid-point of the chassis 100, although second networking module 150 can be inserted in any position on the chassis 100.

As discussed above and further emphasized here, FIG. 1 is merely an example, which should not unduly limit the scope of the claims. One of ordinary skill in the art would recognize many variations, alternatives, and modifications. According to some embodiments, the modules inserted into the chassis 100 could be inserted with different configurations and orientations. A chassis according to some embodiments may accommodate the one or more power supply modules 120*a*-120*d* inserted in a vertical orientation. The chassis may accommodate the one or more auxiliary power supply modules 135*a*-135*d* inserted in a vertical orientation. In some embodiments, the chassis may be configured so that the one or more power supply modules 120*a*-120*d* and the auxiliary power shelf 130 can be mounted on the bottom of the chassis 100. In some embodiments, the chassis may accommodate the one or more first networking modules 140*a*-140*n* inserted in a horizontal orientation. In some embodiments, more than one second networking module 150 may be inserted into the chassis 100.

Figure 2:
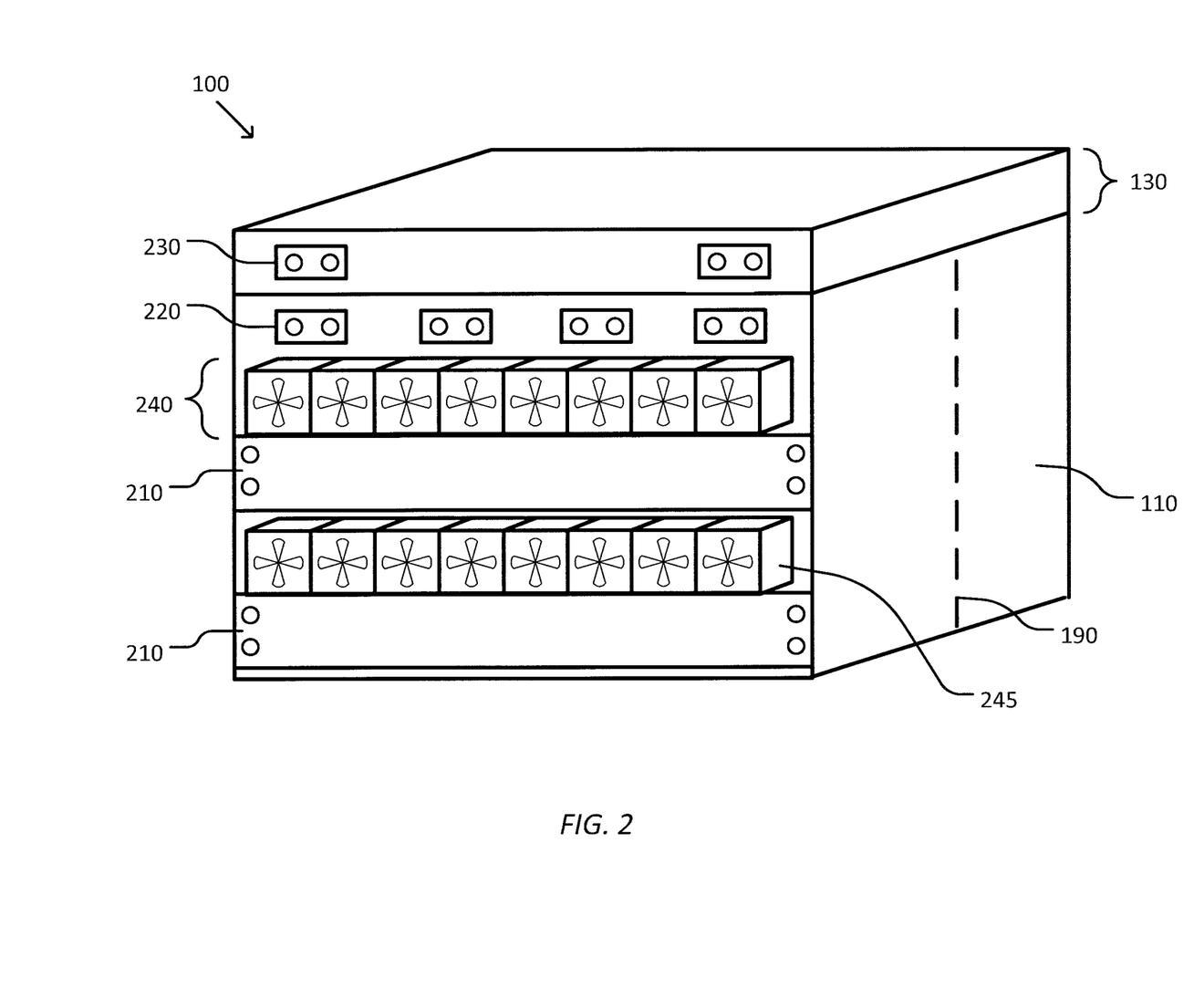
FIG. 2 shows a simplified rear view diagram of the chassis according to some embodiments of the present invention.

FIG. 2 shows a simplified rear view diagram of the chassis 100 according to some embodiments of the present invention. As shown in FIG. 2, the chassis 100 and the frame 110 are configured to receive one or more third networking modules 210. In some embodiments, each of the one or more third networking modules includes route processing modules (RPMs). Each of the one or more third networking modules 210 can typically be inserted into the chassis 100 in an orientation that is orthogonal to the one or more first networking modules 140*a*-140*n* and the second networking module 150. Each of the one or more third networking modules 210 may optionally be affixed to the rear of the frame 110 using one or more fasteners. The one or more fasteners can be knurled screws. By affixing the one or more third networking modules 210 to the frame 110, the one or more third networking modules 210 can be configured to add structural stability to the frame 110.

As additionally shown in FIG. 2, one or more optional first terminal blocks or connectors 220 can be provided for making external connection to the voltages provided by the one or more first power supply modules 120*a*-120*d*. Also provided are one or more optional auxiliary terminal blocks or connectors 230 on the rear of the auxiliary power shelf 130 for making external connection to the voltages provided by the one or more auxiliary power supply modules 135*a*-135*d*.

One or more fan trays 240 can also be mounted to the rear of the chassis 100. Each of the one or more fan trays 240 includes one or more fan modules 245. Each of the one or more fan trays 240 can typically be mounted at a height above a corresponding one of the one or more third networking modules 210. Each of the one or more fan trays 240 can further be configured to provide cooling air flow across the corresponding one or more third networking modules 210 as will be described further below. Each of the one or more fan trays 240 may be mounted so as to extend beyond the back of the chassis 100. Each of the one or more fan trays 240 may be affixed to the rear of the frame 110 using one or more fasteners. The one or more fasteners can be knurled screws. By affixing the one or more fan trays 240 to the frame 110, the one or more fan trays 240 can be configured to add structural stability to the frame 110.

Figure 3:
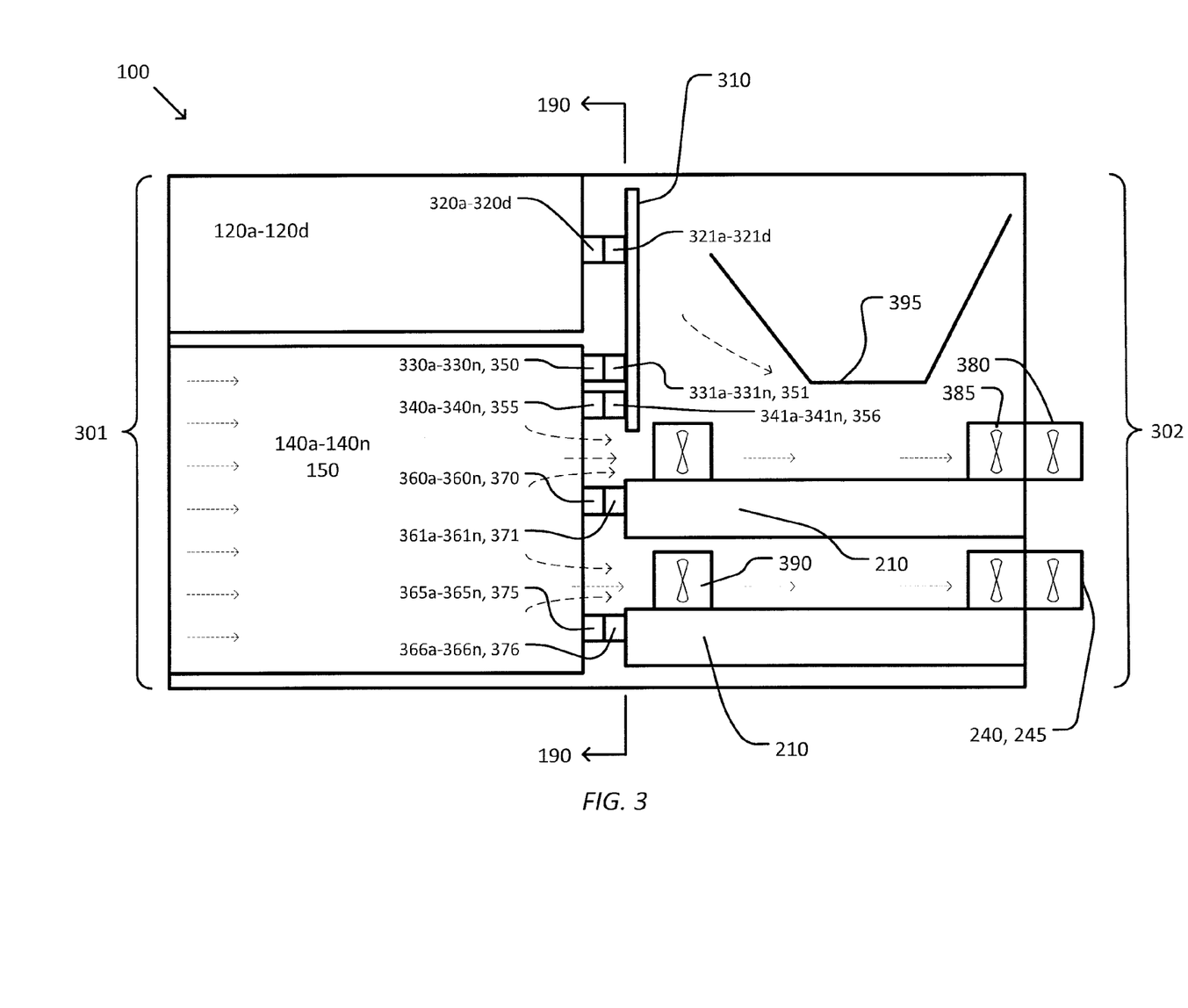
FIG. 3 shows a simplified cut-away side-view diagram of the chassis according to some embodiments of the present invention.

FIG. 3 shows a simplified cut-away side-view diagram of the chassis 100 according to some embodiments of the present invention. As shown in FIG. 3, the front 301 of the chassis 100 is depicted to the left of the figure and the rear 302 of the chassis 100 is depicted to the right of the figure. The one or more power supply modules 120*a*-120*d*, as further described with respect to FIG. 1, can be inserted into the chassis 100 at the top front. Each of the one or more power supply modules 120*a*-120*d* can include a power supply connector 320*a*-320*d*, which is typically located at the rear of the corresponding one or more power supply modules 120*a*-120*d*. Each power supply connector 320*a*-320*d* can be coupled to a corresponding power module connector 321*a*-321*d* mounted on a power distribution board 310. The power distribution board may located at or near the mid-plane 190 of the chassis 100 so that the power distribution board 310 is located nearer to the mid-plane 190 of the chassis than to the front 301 or rear 302 of the chassis. The coupling between the power supply connectors 320*a*-320*d* and the power module connectors 321*a*-321*d* can provide power to the power distribution board 310.

Inserted into the front 301 of the chassis 100 are the various one or more first networking modules 140*a*-140*n* and second networking module 150. Each of the one or more first networking modules 140a-140n can include a first power distribution connector 330a-330n, an optional second power distribution connector 340a-340n, a first communication connector 360a-360n, and a second communication connector 365a-365n, each typically located at the rear of the corresponding one or more first networking modules 140a-140n. Each first power distribution connector 330a-330n can be coupled to a corresponding third power distribution connector 331a-331n mounted on the power distribution board 310. Each second power distribution connector 340a-340n can be coupled to a corresponding fourth power distribution connector 341a-341n mounted on the power distribution board 310. The coupling between the first power distribution connectors 330a-330n and the third power distribution connectors 331a-331n can provide power to the one or more first networking modules 140a-140n. The coupling between the second power distribution connectors 340a-340n and the fourth power distribution connectors 341a-341n may also provide power to the one or more first networking modules 140a-140n. Each first communication connector 360a-360n can be coupled to a corresponding third communication connector 361a-361n, which can be located at the front of a first one of the third networking modules 210. The coupling between each of the first communication connectors 360a-360n and the corresponding third communication connector 361a-361n permits communication and network traffic to pass between the one or more first networking modules 140a-140n and the first one of the third networking modules 210. Each second communication connector 365a-365n can be coupled to a corresponding fourth communication connector 366a-366n, which can be located at the front of a second one of the third networking modules 210. The coupling between each of the second communication connectors 365a-365n and the corresponding fourth communication connector 366a-366n permits communication and network traffic to pass between the one or more first networking modules 140a-140n and the second one of the third networking modules 210.

The second networking module 150 can include a fifth power distribution connector 350, an optional sixth power distribution connector 355, a fifth communication connector 370, and a sixth communication connector 375, each typically located at the rear of the second networking module 150. The fifth power distribution connector 350 can be coupled to a corresponding seventh power distribution connector 351 mounted on the power distribution board 310. The sixth power distribution connector 355 can be coupled to a corresponding eighth power distribution connector 356 mounted on the power distribution board 310. The coupling between the fifth power distribution connector 350 and the seventh power distribution connector 351 can provide power to the second networking module 150. The coupling between the sixth power distribution connector 355 and the eighth power distribution connector 356 may also provide power to the second networking module 150. The fifth communication connector 370 can be coupled to a corresponding seventh communication connector 371, which can be located at the front of the first one of the third networking modules 210. The coupling between the fifth communication connector 370 and the seventh communication connector 371 permits communication and network traffic to pass between the second networking module 150 and the first one of the third networking modules 210. Each sixth communication connector 375 can be coupled to a corresponding eighth communication connector 376, which can be located at the front of the second one of the third networking modules 210. The coupling between each of the sixth communication connector 375 and the eighth communication connector 376 permits communication and network traffic to pass between the second networking module 150 and the second one of the third networking modules 210.

Because communications between the one or more first networking modules 140a-140n and the one or more third networking modules 210 as well as the communications between the second networking module 150 and the one or more third networking modules 210 are made locally using connectors (e.g., the connectors 360a-360n to 361a-361n, 365a-365n to 366a-366n, 370 to 371, and/or 375 to 376) the chassis 100 does not impose any electrical limitations on those communications. Further, the number and spacing of the connectors is based merely on the configuration of the power distribution board 310 and the third networking modules 210 making it possible for the chassis 100 to use first networking modules 140a-140n and the second networking module 150 of varying widths. Thus, the chassis 100 is usable for multiple generations of networking configurations.

Also inserted at the rear of the chassis 100 are the one or more fan trays 240 as further described with respect to FIG. 2. As noted in FIG. 2 and further emphasized here, the one or more fan trays 240 optionally extend beyond the back of the chassis 100. Each of the one or more fan trays 240 includes one or more fan modules 245. As shown in FIG. 3, each of the one or more fan modules 245 can include a first fan 380 and an optional second fan 385. The use of both the first fan 380 and the second fan 385 can serve multiple purposes. The presence of the optional second fan 385 can provide for more air flow through the chassis 100 and thus better cooling capability. Additionally, the second fan 385 can provide redundancy in case of failure of either the first fan 380 or the second fan 385. The chassis 100 also further includes one or more optional third fans 390 located near the mid-plane 190 of the chassis 100. The one or more third fans 390 can help direct air flow from the front portion of the chassis 100 toward the rear portion of the chassis 100. The one or more fan trays 240 and the one or more third fans 390 are typically mounted above a corresponding one of the one or more third networking modules 210.

The chassis 100 may also include one or more baffles 395 to help direct air flow across a surface of each of the one or more third networking modules 210. In combination with ventilation holes located on the front of the one or more first networking modules 140a-140n and the second networking module 150 (as discussed below), air flow can typically be directed from the front 301 of the chassis 100 to the rear 302 of the chassis 100. The general direction of air flow is depicted in FIG. 3 using dashed arrows. This configuration is consistent with data center practice of providing cooling air flow from the front of equipment toward the rear of equipment.

As discussed above and further emphasized here, FIG. 3 is merely an example, which should not unduly limit the scope of the claims. One of ordinary skill in the art would recognize many variations, alternatives, and modifications. According to some embodiments, the power distribution board 310 may further include one or more auxiliary connectors for coupling the one or more auxiliary power supply modules 135a-135d to the power distribution board 310.

Figure 4:
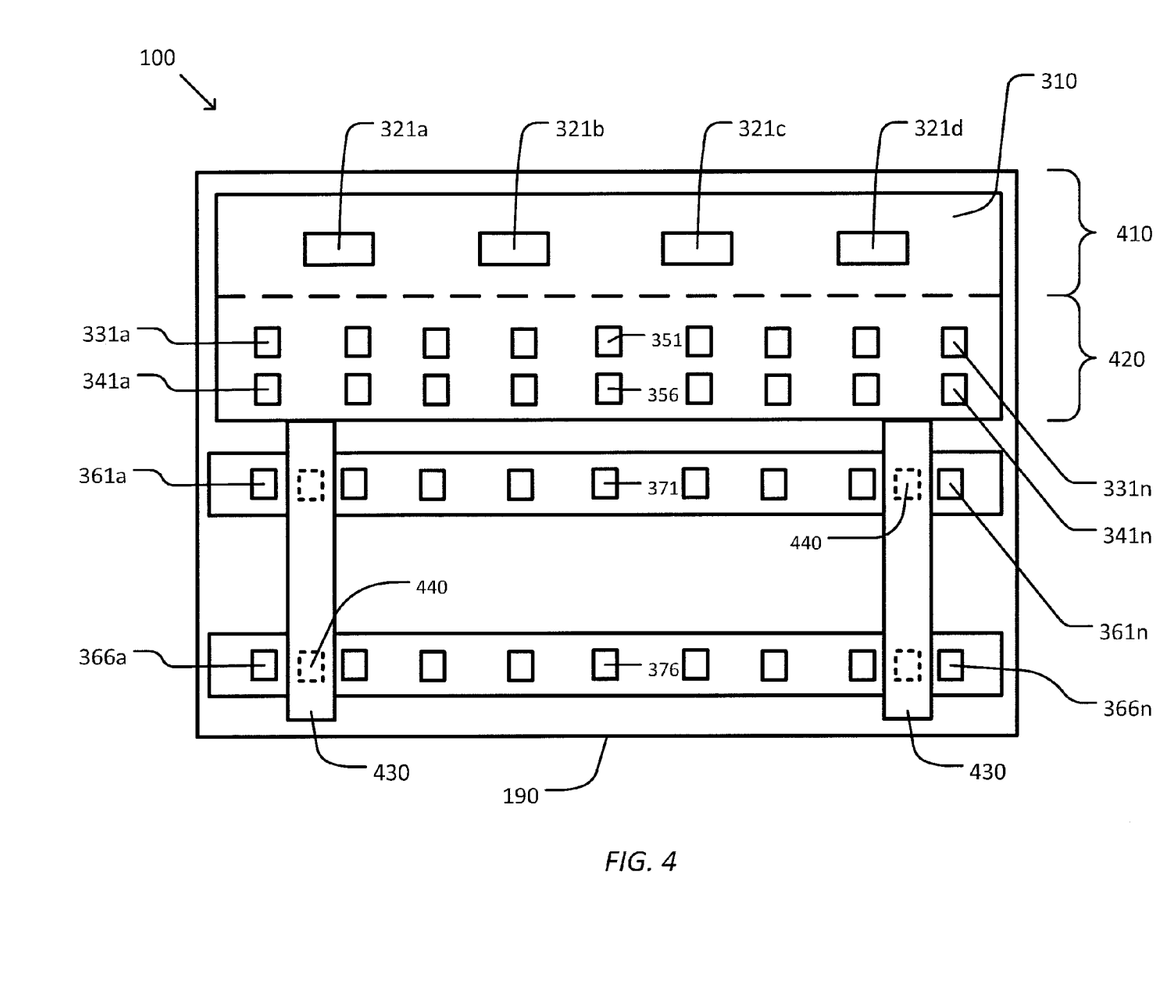
FIG. 4 shows a simplified frontal diagram of the mid-plane of the chassis according to some embodiments of the present invention.

FIG. 4 shows a simplified frontal diagram of the mid-plane 190 of the chassis 100 according to some embodiments of the present invention. As shown in FIG. 4, at the mid-plane 190 of the chassis 100 various connection mechanisms are provided for distributing power to the one or more first networking modules 140a-140n, the second networking module 150, and the one or more third networking modules 210 and for interconnecting the one or more first networking modules 140a-140n and the second networking module 150 to the one or more third networking modules 210. At the upper portion of the chassis 100, the power distribution board 310 provides power connections between the one or more first power supply modules 120a-120d and the one or more first networking modules 140a-140n and the second networking module 150. The one or more power module connectors 321a-321d can be mounted on the power distribution board 310.

FIG. 4 also depicts that the power distribution board 310 extends below a first region 410 corresponding to the one or more first power supply modules 120a-120d and into a second region 420 corresponding to the one or more first network modules 140a-140d and the second network module 150. The one or more third power distribution connectors 331a-331n and the one or more optional fourth power distribution connectors 341a-341n can be mounted on the power distribution board 310 in the second region 420. Additionally, the seventh power distribution connector 351 and the eighth power distribution connector 356 can be mounted on the power distribution board 310 in the second region 420.

Also shown in FIG. 4 is the array of third communication connectors 361a-361n and second communication connectors 366a-366n. Each of the third communication connectors 361a-361n can be mounted on the front of a first one of the third networking modules 210. Each of the fourth communication connectors 366a-366n can be mounted on the front of a second one of the third networking modules 210. Also shown are the seventh communication connector 371 and the eighth communication connector 376 mounted on the front of the first one of the third networking modules 210 and the front of the second one of the third networking modules 210, respectively. Further, the number and spacing of the power distribution and communication connectors (e.g., the connectors 331a-331n, 351, 341a-341a, 356, 361a-361n, 371, 366a-366n, and/or 376) can be based merely on the configuration of the power distribution board 310 and the third networking modules 210 making it possible for the chassis 100 to use first networking modules 140a-140n and the second networking module 150 of varying widths. Thus, the chassis 100 is usable for multiple generations of networking configurations.

Although not depicted in FIG. 3, FIG. 4 also shows one or more interconnect boards 430. Each of the one or more interconnect boards 430 can be configured to distribute power from the power distribution board 310 to the first one of the third networking modules 210 and the second one of the third networking modules 210 and/or to provide one or more communication paths between the first one of the third networking modules 210 and the second one of the third networking modules 210. Located on the rear face of the one or more interconnect boards 430 are one or more connectors 440 that can be configured to receive corresponding connectors mounted at the front of the first one of the second networking modules 210 and the second one of the third networking modules 210. In some embodiments, the one or more interconnect boards 430 may be extensions to the power distribution board 310. In other embodiments, the one or more interconnect boards 430 may be connected to either the front or the rear of the power distribution board 310 using corresponding connectors.

Figure 5:
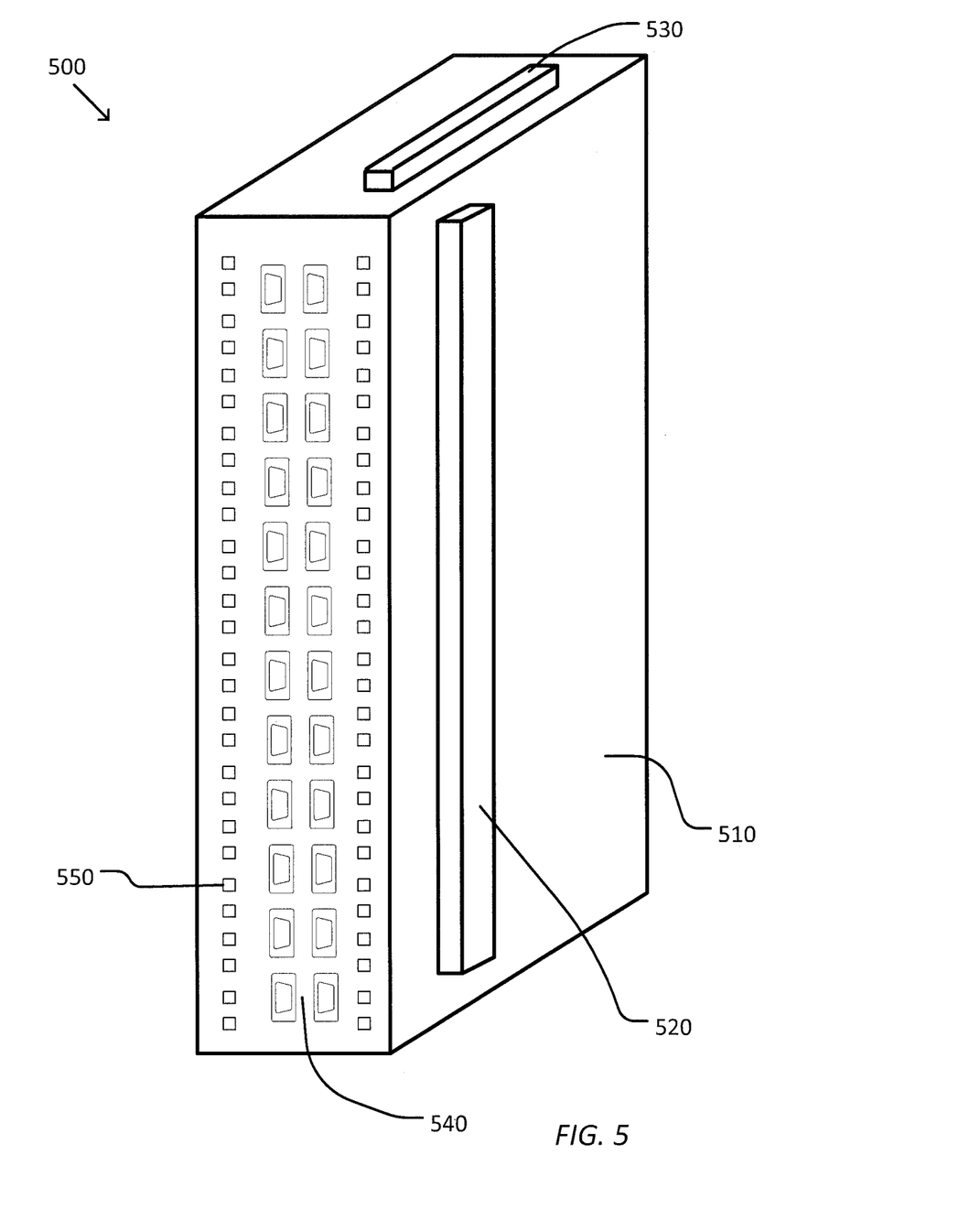
FIG. 5 shows a simplified diagram of a first networking module according to some embodiments of the present invention.

FIG. 5 shows a simplified diagram of a first networking module 500 according to some embodiments of the present invention. In some embodiments, the first networking module 500 is representative of any one of the one or more first networking modules 140a-140n. As shown in FIG. 5, the first networking module 500 can typically be enclosed on five sides by a rigid or semi-rigid first networking module housing 510. The first networking module housing 510 may enclose the front, top, bottom, and two sides of the first networking module 500 with the rear being left open to allow connections to a corresponding one of the one or more first power distribution connectors 330a-330n, a corresponding one of the one or more second power distribution connectors 340a-340n, a corresponding one of the one or more first communication connectors 360a-360n, and a corresponding one of the one or more second communication connectors 365a-365n. In some embodiments, the corresponding one of the one or more second power distribution connectors 340a-340n may be optional.

The first networking module housing 510 typically includes a metal. The metal includes one or more selected from a group consisting of sheet metal, aluminum, steel, and the like. One or more electromagnetic interference (EMI) gaskets 520 can be mounted to the outside of the first networking module housing 510. The one or more EMI gaskets 520 can be configured to provide additional EMI shielding to the gaps between the first networking module 500 and adjacent modules or the chassis frame 110. One or more optional module alignment elements 530 can also be mounted to the outside of the first networking module housing 510. The one or more module alignment elements 530 can be configured to provide keying so that the first networking module 500 may only be installed into the chassis 100 with a proper positioning and orientation.

As further shown in FIG. 5, the front of the first networking module 500 can include an array of network connectors 540. The array of network connectors 540 can be selected based on the number and type of network connections that are desired for connecting to external devices. The first networking module housing 510 may further include an array of ventilation holes 550 on its front face. The ventilation holes 550 permit the flow of air into the chassis 100 and across the interior of the first networking module 500.

Figure 6:
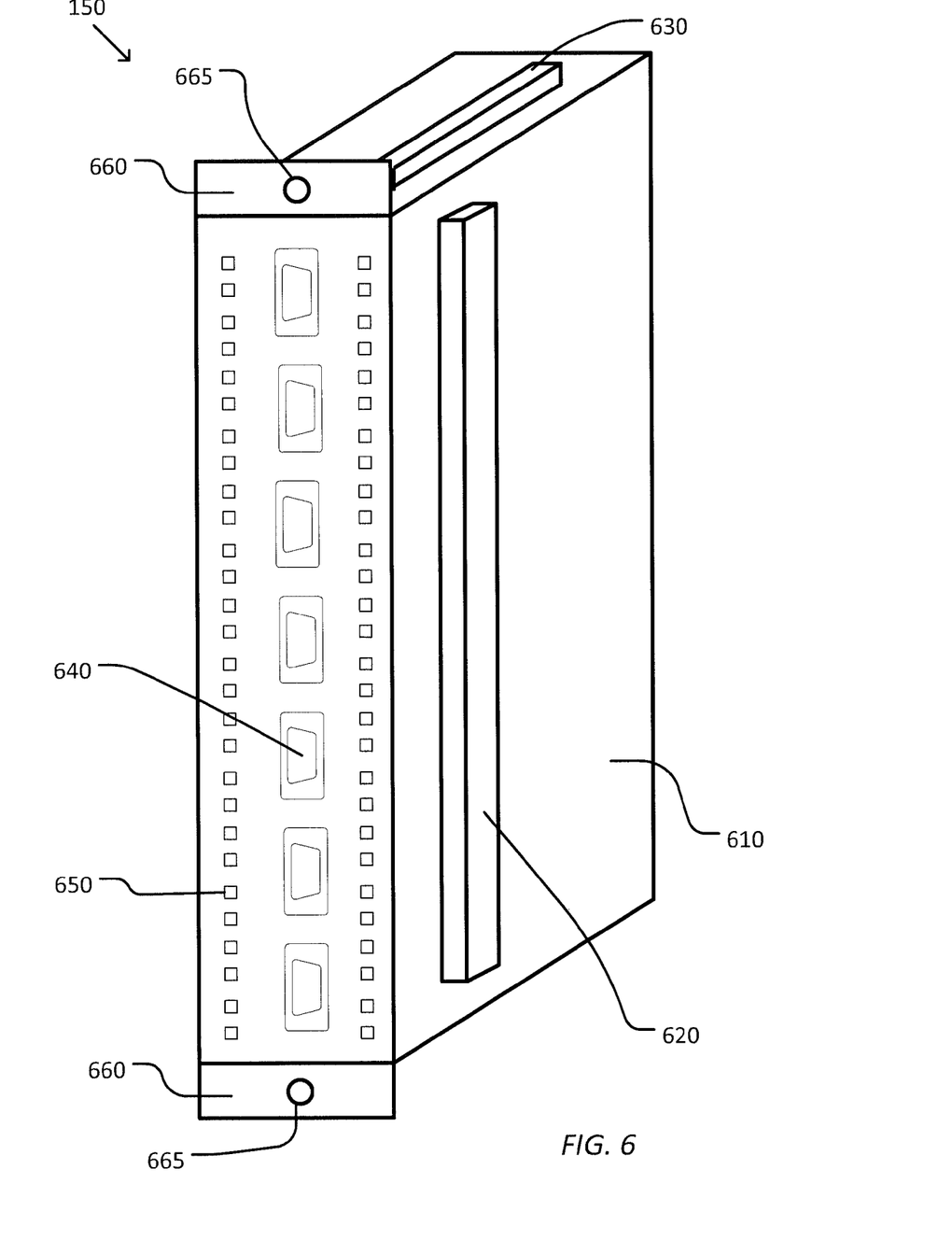
FIG. 6 shows a simplified diagram of the second networking module according to some embodiments of the present invention.

FIG. 6 shows a simplified diagram of the second networking module 150 according to some embodiments of the present invention. As shown in FIG. 6, the second networking module 150 can typically be enclosed on five sides by a rigid or semi-rigid second networking module housing 610. The second networking module housing 610 may enclose the front, top, bottom, and two sides of the second networking module 150 with the rear being left open to allow connections to the fifth power distribution connector 350, the sixth power distribution connector 355, the fifth communication connector 370, and the sixth communication connector 375. In some embodiments, the fourth power distribution connector 355 may be optional.

The second networking module housing 610 typically includes a metal. The metal includes one or more selected from a group consisting of sheet metal, aluminum, steel, and the like. One or more EMI gaskets 620 can be mounted to the outside of the second networking module housing 610. The one or more EMI gaskets 620 can be configured to provide additional EMI shielding to the gaps between the second networking module 150 and adjacent modules or the chassis frame 110. One or more optional module alignment elements 630 can also be mounted to the outside of the second networking module housing 610. The one or more module alignment elements 630 can be configured to provide keying so that the second networking module 150 can only be installed into the chassis 100 with a proper positioning and orientation. The second networking module 150 may further include one or more mounting flanges 660. The mounting flanges 660 can typically include a mounting hole 665. The one or more mounting flanges 660 and their corresponding mounting holes 665 may be used to affix the second network module 150 to the frame 110 as further described above with respect to FIG. 1.

As further shown in FIG. 6, the front of the second networking module 150 can include an array of network connectors 640. The array of network connectors 640 can be selected based on the number and type of network connections that are desired for connecting external devices. The second networking module housing 610 may further include an optional array of ventilation holes 650 on its front face. The ventilation holes 650 permit the flow of air into the chassis 100 and across the interior of the second networking module 150.

Figure 7:
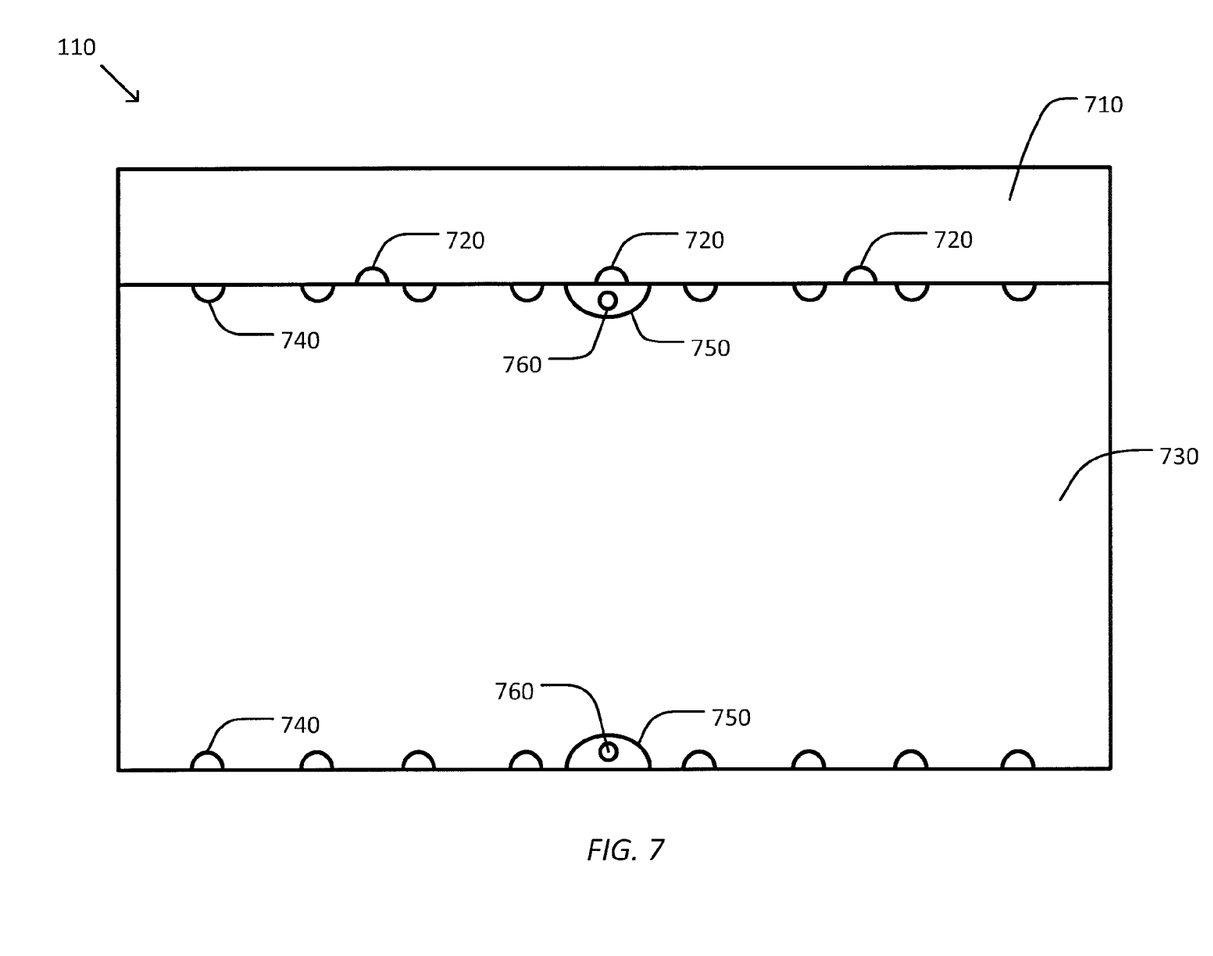
FIG. 7 shows a simplified front view diagram of the frame according to some embodiments of the present invention.

FIG. 7 shows a simplified front view diagram of the frame 110 according to some embodiments of the present invention. As shown in FIG. 7, the frame 110 can divide the interior of the chassis 100 into several regions. The frame 110 can typically include a metal. The metal includes one or more selected from a group consisting of sheet metal, aluminum, steel, and the like. Because the second networking module 150, the one or more fan trays 240 and/or the one or more third networking modules 210 can be affixed to the frame 110 and configured to provide stability to the frame 110, the frame 110 can use less material than a conventional chassis frame. This reduces the manufacturing cost of the frame 110 relative to a conventional chassis frame.

A power supply region 710 can typically be located at the top of the chassis 100 and can be configured to receive one or more first power supply modules 120a-120d. The frame 110 in the power supply region 710 may also include one or more power supply guides 720. Each of the one or more power supply guides 720 can be configured to aid in the positioning and alignment of the one or more first power supply modules 120a-120d. In some embodiments, the one or more power supply guides 720 may be positioned between each of the one or more first power supply modules 120a-120d. In some embodiments, the one or more power supply guides 720 may be positioned to align with one or more alignment elements located on the exterior of the one or more first power supply modules 120a-120d.

FIG. 7 also shows a networking module region 730 in the frame 110 that can located below the power supply region 710. The networking module region 730 can be configured to receive the one or more first networking modules 140a-140n and the second networking module 150. The frame 110 in the networking module region 730 may also include one or more networking module guides 740. Each of the one or more networking module guides 740 can be configured to aid in the positioning and alignment of the one or more first networking modules 140a-140n and optionally the second networking module 150. In some embodiments, the one or more networking module guides 740 may be positioned between each of the one or more first networking modules 140a-140n and optionally between the second networking module 150 and the adjacent first networking modules 140a-140n. In some embodiments, the one or more networking module guides 740 may be positioned to align with one or more alignment elements 530 located on the exterior of the respective first networking module housing 510. In some embodiments, the one or more networking module guides 740 may be optionally positioned to align with one or more alignment elements 630 located on the exterior of the second networking module housing 610.

Also shown in FIG. 7 are one or more mounting tabs 750. Each of the one or more mounting tabs 750 can include a mounting hole 760. The one or more mounting tabs 750 and their corresponding mounting holes 760 can be configured to align with the one or more mounting flanges 660 and corresponding mounting holes 665 of the second networking module as further described with respect to FIG. 6. The second networking module 150 may be affixed to the frame 110 using one or more fasteners in combination with the one or more mounting tabs 750 and the one or more mounting flanges 660 as further described with respect to FIG. 1.

As discussed above and further emphasized here, FIG. 7 is merely an example, which should not unduly limit the scope of the claims. One of ordinary skill in the art would recognize many variations, alternatives, and modifications. According to some embodiments, the frame 110 may also include rack mounting flanges around the outside front edges of the frame 110 and which can be configured to mount the chassis 100 to an equipment rack.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. An electrical equipment chassis, the chassis comprising:
   a frame open to a first side of the chassis and a second side of the chassis opposite the first side;
   a first region being open to the first side of the chassis, and configured to receive one or more first networking modules oriented with a first orientation;
   a second region being open to the second side of the chassis and configured to receive one or more fan trays and one or more second networking modules, the one or more second networking modules being oriented with a second orientation orthogonal to the first orientation; and
   a power distribution board located near a mid-plane of the chassis and including one or more power connectors for coupling the one or more first networking modules to power being distributed on the power distribution board;
   wherein:
   the power distribution board only partially separates the first region from the second region; and
   the chassis is sufficiently open to permit air flow from the first side to the second side.

2. The chassis of claim 1 wherein each of the one or more first networking modules is coupled to each of the second networking modules near the mid-plane of the chassis using one or more connectors.

3. The chassis of claim 1 wherein at least one of the first networking modules, the one or more fan trays, or the one or more second networking modules are configured to be affixed to the frame.

4. The chassis of claim 1 wherein the one or more first networking modules includes one or more line cards or one or more service modules.

5. The chassis of claim 1 wherein the one or more second networking modules include one or more route processing modules.

6. The chassis of claim 1 wherein the first region is further configured to receive a third networking module oriented with the first orientation, the third networking module being coupled to each of the second networking modules near the mid-plane of the chassis using one or more connectors.

7. The chassis of claim 6 wherein the third networking module includes an uplink module.

8. The chassis of claim 6 wherein the third networking module adds stability to the frame.

9. The chassis of claim 1, further comprising a third region configured to receive one or more power supply modules for supplying power to the chassis and the power distribution board.

10. The chassis of claim 9 wherein the third region is adjacent to the first region and is open to the first side.

11. The chassis of claim 1, further comprising an auxiliary power shelf configured to receive one or more auxiliary power modules.

12. The chassis of claim 1 wherein the one or more fan trays are configured to extend beyond the second side of the chassis.

13. The chassis of claim 1, further comprising one or more additional fans located near the mid-plane of the chassis.

14. The chassis of claim 1, further comprising one or more air baffles.

15. The chassis of claim 1 wherein at least one of the one or more first networking modules includes an electromagnetic interference gasket.

16. The chassis of claim 1 wherein at least one of the one or more first networking modules includes an alignment element.

17. The chassis of claim 1 wherein at least one of the one or more first networking modules includes an array of ventilation holes open to the first side of the chassis.

18. The chassis of claim 1 wherein at least one of the first networking modules or the one or more fan trays adds stability to the frame.

19. The chassis of claim 1 wherein the one or more fan trays each includes one or more fans.

20. An information handling system comprising:
one or more electrical equipment chassis, each chassis comprising:
a frame open to a first side of the chassis and a second side of the chassis opposite the first side;
a first region being open to the first side of the chassis, and configured to receive one or more first networking modules oriented with a first orientation;
a second region being open to the second side of the chassis and configured to receive one or more fan trays and one or more second networking modules, the one or more second networking modules being oriented with a second orientation orthogonal to the first orientation; and
a power distribution board located near a mid-plane of the chassis and including one or more power connectors for coupling the one or more first networking modules to power being distributed on the power distribution board;
wherein:
the power distribution board only partially separates the first region from the second region; and
the chassis is sufficiently open to permit air flow from the first side to the second side.

* * * * *